US012775761B2

(12) United States Patent
Kirschner

(10) Patent No.: US 12,775,761 B2
(45) Date of Patent: Oct. 27, 2026

(54) INTEGRATED CIRCUIT WITH FIB-READY STRUCTURES

(71) Applicant: NUVOTON TECHNOLOGY CORPORATION, Hsin-chu (TW)

(72) Inventor: Yuval Kirschner, Even Yehuda (IL)

(73) Assignee: Nuvoton Technology Corp., Hsinchu (TW)

(*) Notice: Subject to any disclaimer, the term of this patent is extended or adjusted under 35 U.S.C. 154(b) by 836 days.

(21) Appl. No.: 18/187,700

(22) Filed: Mar. 22, 2023

(65) Prior Publication Data

US 2024/0321548 A1 Sep. 26, 2024

(51) Int. Cl.

| | |
|---|---|
| ***G06F 30/30*** | (2020.01) |
| ***G06F 30/392*** | (2020.01) |
| ***G06F 30/398*** | (2020.01) |
| ***H10P 74/00*** | (2026.01) |
| ***H10P 74/20*** | (2026.01) |
| ***H10W 20/00*** | (2026.01) |
| *H10W 20/49* | (2026.01) |

(52) U.S. Cl.

CPC ............ *G06F 30/30* (2020.01); *G06F 30/392* (2020.01); *G06F 30/398* (2020.01); *H01J 2237/31749* (2013.01); *H10P 74/207* (2026.01); *H10P 74/232* (2026.01); *H10P 74/27* (2026.01); *H10P 74/273* (2026.01); *H10W 20/49* (2026.01)

(58) Field of Classification Search

None

See application file for complete search history.

(56) References Cited

U.S. PATENT DOCUMENTS

| | | | | |
|---|---|---|---|---|
| 5,696,943 | A | 12/1997 | Lee | |
| 5,741,557 | A | 4/1998 | Corbin et al. | |
| 5,936,876 | A * | 8/1999 | Sugasawara | G01R 1/073 365/230.02 |
| 6,156,579 | A * | 12/2000 | Khatri | H10W 46/00 257/E23.179 |
| 6,255,845 | B1 | 7/2001 | Wong et al. | |
| 6,455,334 | B1 * | 9/2002 | Goruganthu | G01R 31/2884 977/854 |

(Continued)

FOREIGN PATENT DOCUMENTS

| | | | |
|---|---|---|---|
| CN | 203895447 | U * | 10/2014 |
| TW | I239065 | B | 9/2005 |

(Continued)

OTHER PUBLICATIONS

Chen et al., "Design-for-Debug Layout Adjustment for FIB Probing and Circuit Editing," Proceedings of IEEE International Test Conference, IEEE, pp. 1-9, year 2011.

(Continued)

*Primary Examiner* — Leigh M Garbowski

(74) *Attorney, Agent, or Firm* — Meitar Patents LTD.; Daniel Kligler

(57) ABSTRACT

An Integrated Circuit (IC), designed for debugging by Focused Ion Beam (FIB) editing, includes functional circuitry, a network of Basic FIB elements (BFEs), and routing circuitry. The functional circuitry includes functional nodes. Each of the BFEs includes a respective metal pad configured to be connected to one of the functional nodes using FIB editing. The routing circuitry is configured to route one or more selected BFEs for analysis.

17 Claims, 6 Drawing Sheets

(56) References Cited

U.S. PATENT DOCUMENTS

| | | | | |
|---|---|---|---|---|
| 6,480,990 | B1 * | 11/2002 | Sharp | G06F 30/30<br>714/E11.111 |
| 7,087,927 | B1 * | 8/2006 | Weaver | H10W 20/494<br>257/E23.15 |
| 8,312,407 | B2 * | 11/2012 | Chowdhury | G01R 31/2884<br>716/54 |
| 2002/0138817 | A1 * | 9/2002 | Lee | G06F 30/39<br>716/112 |
| 2004/0028345 | A1 * | 2/2004 | Endo | B29C 66/1122<br>385/78 |
| 2005/0224950 | A1 * | 10/2005 | Tsai | H10P 74/232<br>257/E27.105 |
| 2005/0263894 | A1 * | 12/2005 | Huber | H10W 20/067<br>438/622 |
| 2007/0124713 | A1 * | 5/2007 | Ando | G06T 7/001<br>250/307 |
| 2008/0028345 | A1 * | 1/2008 | Suri | G06F 30/30<br>716/132 |
| 2010/0187525 | A1 * | 7/2010 | Bartley | H10W 42/405<br>257/E23.002 |
| 2010/0201395 | A1 * | 8/2010 | Ukai | G01R 31/2884<br>257/536 |
| 2015/0137311 | A1 * | 5/2015 | Reber | H10W 20/494<br>257/529 |
| 2019/0311156 | A1 * | 10/2019 | Tehranipoor | G06F 21/76 |
| 2021/0035924 | A1 * | 2/2021 | Best | H10W 42/405 |
| 2023/0197537 | A1 * | 6/2023 | Geiger | H10P 74/273<br>257/48 |

FOREIGN PATENT DOCUMENTS

| | | |
|---|---|---|
| TW | 201135859 A | 10/2011 |
| TW | 202114128 A | 4/2021 |

OTHER PUBLICATIONS

Sarkari et al., "Method and Apparatus for Failure Analysis Using Spare Gates," Application for Provisional Application, IP.com Prior Art Database Technical Disclosure, pp. 1-30, Dec. 8, 2003.

Livengood et al., "Design for (Physical) Debug for Silicon Microsurgery and Probing of Flip-Chip Packaged Integrated Circuits," Proceedings of IEEE International Test Conference, pp. 877-882, year 1999.

Lee et al., "Design-for-Debug Routing for FIB Probing," Paper, Department of Electrical Engineering, National Central University, Taoyuan, Taiwan, EDAA, pp. 1-4, year 2014.

Wang et al., "The Effect of FIB Technology on Design Methodology," Proceedings of IEEE Midwest Symposium on Circuits and Systems, vol. 1, pp. 725-728, year 1993.

* cited by examiner

INTEGRATED CIRCUIT WITH FIB-READY STRUCTURES

FIELD OF THE INVENTION

The present invention relates generally to the debug of integrated circuits (ICs), and particularly to the use of Focused Ion Beam (FIB) for debugging of ICs.

BACKGROUND OF THE INVENTION

FIB techniques are often used for the analysis and debug of ICs.

In "Design-for-debug routing for FIB probing", by Chia-Yi Lee et. al., Design, Automation & Test in Europe Conference 24-28 Mar. 2014 (DOI: 10.7873/DATE.2014.333), the authors assert that FIB is one of the most popular physical probing technologies to observe internal signals in post-silicon debug; however, an unsuitable layout significantly decreases the percentage of nets which can be observed through FIB probing for advanced process technologies. The authors then present design-for-debug routing to increase the FIB observable rate. The proposed algorithm, which adopts three FIB states and costs to enhance the maze routing, keeps at least one FIB candidate for each net while routing. Experimental results demonstrate that the proposed method can significantly increase the FIB observable rate.

Further background can be found in Taiwan patent I239065, which discloses an integrated circuit for both ECO (engineering change order) and FIB (focused ion beam) debugging. The integrated circuit includes a substrate, a spare cell, a top layer output terminal pad and a top layer input terminal pad. The spare cell, which has at least one input terminal and at least one output terminal, is placed at the edge of the substrate. The top layer output terminal pad and the top layer input terminal pad are placed in a top metal layer. The top metal layer is placed on the substrate. The top layer output terminal pad and the top layer input terminal pad connect to the output terminal and input terminal of the spare cell by via.

SUMMARY OF THE INVENTION

An embodiment of the present invention that is described herein provides an Integrated Circuit (IC) designed for debugging by Focused Ion Beam (FIB) editing. The IC includes functional circuitry, a network of Basic FIB elements (BFEs), and routing circuitry. The functional circuitry includes functional nodes. Each of the BFEs includes a respective metal pad configured to be connected to one of the functional nodes using FIB editing. The routing circuitry is configured to route one or more selected BFEs for analysis.

In some embodiments, each BFE among one or more of the BFEs further includes a respective supply-path circuit configured to provide a galvanic path between the BFE and a supply input of the IC. The supply-path circuit may include a passive resistor that is coupled to a supply rail of the IC, an active resistance path to a supply rail of the IC, or a keeper circuit.

In a disclosed embodiment, the BFEs are geometrically distributed across the IC so that a maximum distance between any functional node and a nearest BFE is not larger than a maximum predefined FIB-distance. In some embodiments, at least some of the metal pads of the BFEs are disposed in a Metal-1 layer of the IC. In some embodiments, at least some of the metal pads of the BFEs are disposed in a Top Metal layer of the IC.

In an embodiment, the routing circuitry is configured to route the selected BFEs to one or more external connections of the IC. In an embodiment, the IC further includes an on-chip analysis circuit configured to perform at least part of the analysis, and the routing circuitry is configured to route one or more of the selected BFEs to the on-chip analysis circuit. In a disclosed embodiment, the routing circuitry includes one or more multiplexers. In another embodiment, the routing circuitry includes a chain of buffers.

In yet another embodiment, the IC further includes a FIB-connection pad, which is (i) connected to a functional node of the functional circuitry, (ii) fabricated in a same layer as a metal pad of a given BFE, and (iii) configured to be connected using FIB editing to the metal pad of the given BFE. In still another embodiment, in a given BFE, the metal pad at least partially overlaps the supply-path circuit.

There is additionally provided, in accordance with an embodiment that is described herein, a method for producing an Integrated Circuit (IC) designed for debugging by Focused Ion Beam (FIB) editing. The method includes fabricating in the IC functional circuitry including functional nodes. A network of Basic FIB elements (BFEs) is fabricated in the IC, each BFE including a respective metal pad configured to be connected to one of the functional nodes using FIB editing. Routing circuitry is fabricated in the IC, the routing circuitry configured to route one or more selected BFEs for analysis.

There is further provided, in accordance with an embodiment that is described herein, a method for debugging an Integrated Circuit (IC) by Focused Ion Beam (FIB) editing. The method includes operating an IC that includes (i) functional circuitry including functional nodes, (ii) a network of Basic FIB elements (BFEs) each including a respective metal pad configured to be connected to one of the functional nodes using FIB editing, and (iii) routing circuitry configured to route one or more selected BFEs for analysis. FIB editing is applied to at least a selected functional node among the functional nodes and to at least a selected BFE among the BFEs. A signal is monitored on the selected functional node using the routing circuitry.

In some embodiments, applying the FIB editing includes connecting the selected functional node to the selected BFE using FIB deposition. In some embodiments, applying the FIB editing further includes disconnecting a supply-path circuit from the metal pad of the selected BFE using FIB etching. In some embodiments, applying the FIB editing includes disconnecting a transistor of a supply-path circuit of the selected BFE using FIB etching.

The present invention will be more fully understood from the following detailed description of the embodiments thereof, taken together with the drawings in which:

DETAILED DESCRIPTION OF EMBODIMENTS

Overview

Figure 1:
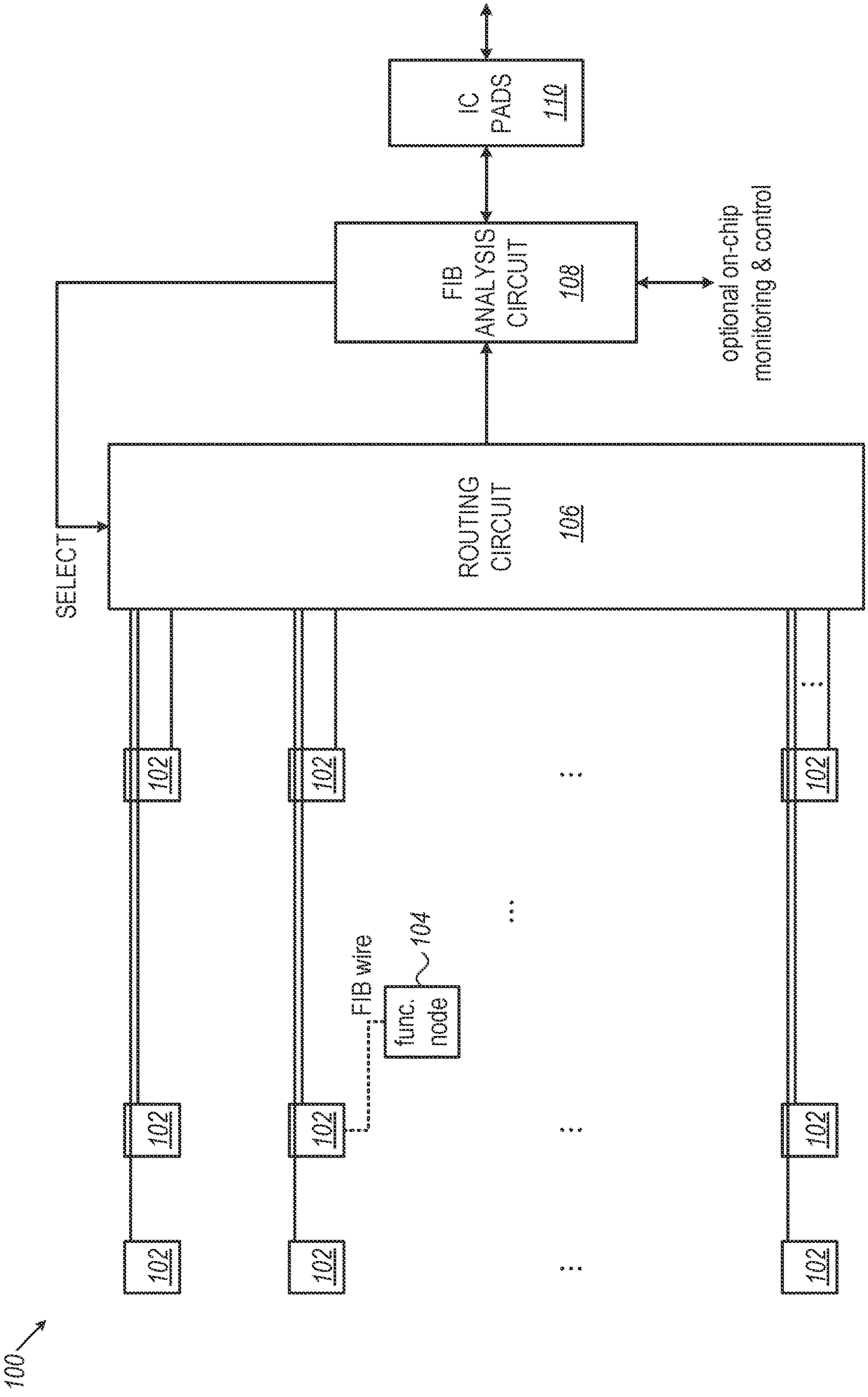
FIG. 1 is a block diagram that schematically illustrates an IC with FIB-support circuitry, in accordance with an embodiment of the present invention.

Due to the high complexity of modern integrated circuits (ICs), and despite the remarkable improvements in Electronic Design Automation (EDA) tools, the first production samples ("first silicon") of complex integrated circuits are, in most cases, faulty, and need to be debugged.

The debug process, in this case, is often considered urgent because the IC needs to be corrected as soon as possible to avoid delays and additional costs in the production process. If the issues with the first silicon are not identified and resolved, it can result in a significant loss of time and resources, as well as a potential loss of revenue and, sometimes, impact the reputation of the silicon vendor.

The urgency of the debug, coupled with the complexity of some modern ICs (that sometimes comprise billions of transistors) make the debug process stressful and challenging.

Debugging of the IC requires observing and, sometimes, manipulating internal signals, by way of physical probing of nodes in the IC. Focused ion beam (FIB) is one of the most popular probing technologies. However, an unsuitable layout significantly decreases the percentage of nets which can be observed through FIB probing for advanced process technologies. (FIB probing, in the current context, refers to forming a pad using FIB for probing by a mechanical prober needle, and/or using FIB to route a signal to a pad in the IC.)

Embodiments according to the present invention that are disclosed herein provide for methods and systems that ease FIB-aided analysis. In an embodiment, the IC designer inserts a network (e.g., a regular grid) of Basic FIB Elements (BFEs) in the IC, so that any node in the design will be within no more than a maximal predefined distance from the nearest BFE. For example, for an equally-spaced grid of 500μ×500μ that covers the complete IC area, the maximum distance will be 250μ horizontally and 250μ vertically. (We will refer hereinbelow to all the devices and nodes of the IC design that are not part of the BFEs as functional design devices and nodes.)

In some embodiments, each BFE comprises a metal pad for easy access by a FIB. The metal pad is located, in embodiments, in the "Metal 1" (M1) layer for easy access by backside FIB; in other embodiments the metal pad is in the top metal, for easy access by frontside FIB, and in yet other embodiments the metal pad comprises an M1 pad and a top metal layer pad, for easy backside and frontside FIB access.

In addition to the metal pad, each BFE comprises a supply-path circuit, configured to provide a low-impedance galvanic path from the metal pad to a supply input of the IC. We will refer below to the supply path circuit also as a Float Prevention circuit; the impedance (to the supply) of the float prevention circuit is, in embodiments, lower than the minimum expected leakage impedance.

Initially, i.e., before the debug process begins, the BFEs are not connected to the functional design nodes. If a certain node of the functional design needs to be examined as part of a debug process, the node can be connected to a nearby BFE using FIB edit. As will be explained below, the FIB edit may involve FIB deposition and, sometimes, FIB etching, depending on the BFE implementation.

In some embodiments, the BFEs are input to a routing circuit, which selects, according to a Select code, a subset of the BFEs whose signals are to be routed for analysis. The select code is provided, in an embodiment, in one or more external connections (will be referred to hereinbelow as "pads") of the IC. In some embodiments, the signals from the selected FBEs are analyzed on-chip in a FIB analysis circuit. In other embodiments, the FIB analysis circuit sends the selected signals to output pads of the IC for off-IC analysis, and/or sends the Select code from input pads of the IC to the routing circuit.

In an embodiment, the BFE grid comprises multiple horizontal chains of BFEs that span the width of the IC, starting from a supply connection (e.g., at the left end of the chain) and ending (e.g., at the right end) at inputs to the routing circuit. To connect a functional node for analysis, the user selects the nearest BFE, cuts, using FIB etch, the respective metal pad at the left side (e.g., towards the supply connection) and connects the functional node to the right side of the metal pad. (The term "horizontal" hereinabove refers to an arbitrary dimension of the chip; the terms "left" and "right" refer to two arbitrary ends of the dimension and may be interchanged.)

In another embodiment, to allow easy frontside FIB access to active devices, some or all of the active devices of the IC are connected to probe points in the upper metal layer.

Similarly, to allow easy backside FIB access, some or all metal lines may be connected to pads on "metal 1" segments having no active device underneath (e.g., routed above a filler, a decap cell, etc.) so it can be easily accessed from the backside without destroying a functional device.

Thus, in embodiments, a relatively easy FIB analysis of complex ICs is facilitated by adding suitable structures to the functional design, simplifying both FIB edit and debug operations.

System Description

Micro-probing using Focused Ion Beam (FIB) is a powerful technique for the analysis and characterization of complex integrated circuits (ICs).

The FIB process includes depositing of layers to create pads that can be accessed by micro-probing and to connect the pads to circuit nodes; the FIB process may also include etching (typically for the purpose of disconnecting coupled nodes).

The micro-probing procedure is done, in cases, on the top of the IC ("frontside FIB") or, in other cases, on the bottom of the IC ("backside FIB").

FIB debug of complex ICs is challenging due to the small feature size, the complexity of the inter-device routing and the high speeds involved; FIB debug and micro-probing may be close to impossible if the IC designer does not take measures to simplify FIB during the design process. In particular, accessing a plurality of FIB pads in a small area, using mechanical probe needles, may be challenging and, sometimes, impossible.

According to embodiments of the present invention, the designer adds FIB-support circuitry to the IC, including a matrix of basic FIB elements (BFEs) that are distributed (e.g., evenly) in the IC (and, thus, the maximum distance between any node and the closest BFE can be bounded), a routing circuit and optionally a FIB analysis circuit. In both cases, mechanical probing is not needed for the analysis of the IC, which can be done by through the IC pads.

FIG. 1 is a block diagram that schematically illustrates an IC 100 with FIB-support circuitry 100, in accordance with an embodiment of the present invention.

The IC comprises a matrix of BFEs 102, that are evenly distributed in the IC. For example, in an embodiment, the BFEs are in a 500μ×500μ rectangular grid (e.g., the distance between neighbor BFEs, horizontally and vertically, is 500μ). This guarantees that the maximum distance between any functional node of the IC to the nearest BFE will be 250μ horizontally and 250μ vertically. In other embodiments, any other suitable grid sizes and types may be used, including, for example, a hexagonal grid or even an irregular, a-periodic, grid.

According to the example embodiment illustrated in FIG. 1, a functional node 104 is to be analyzed using FIB. A metal wire (dotted line) is deposited by the FIB equipment, connecting node 104 to the nearest BFE 102 (as will be described below, connecting a function node to a BFE may comprise etching in addition to depositing).

The BFEs are coupled to a routing circuit 106, which is configured to output, respective to a Select input, one or more of the BFEs to a FIB analysis circuit 108. In embodiments, routing circuit 106 may be a multiplexer.

FIB analysis circuit 108 is configured to drive the Select control of the routing circuit, thereby selecting the signals that the routing circuit outputs, optionally analyze the signals, and send outputs to IC pads 110. In some embodiments, the FIB analysis circuit sends the routed signals unchanged to the IC pads (in embodiments, IC pads 110 comprise output buffers). In other embodiments, FIB analysis circuit 108 may comprise analysis circuits such as counters, memory elements and the like. In an embodiment, the number of IC pads is smaller than the number of routed signals. For example, in an embodiment, the FIB analysis circuit stores the routing circuit outputs in a register, and then sends the register contents serially, over a small number of IC pads.

In embodiments, the FIB analysis circuit transfers data from input IC pads directly to the Select inputs of the router. In other embodiments, the FIB analysis circuit may generate the select autonomously, for example, the Select may be a counter, which the FIB analysis circuit increments periodically.

In some embodiments, the IC comprises a monitoring and control circuit (not shown), which is configured to set the Select input of the routing circuit and/or to input signals from the FIB analysis circuit, and then analyze the signals (e.g., store the signals in a buffer); in an embodiment the monitoring and control circuit is a processor.

The configuration of IC with FIB-support circuitry 100 illustrated in FIG. 1 and described herein above is cited by way of example. Other configurations may be used in alternative embodiments. For example, in some embodiments the grid of BFEs is not uniform and may be denser in complex logic areas than above arrays. In embodiments, there may be separate FIB zones for separate functions of the IC. In some embodiments, the routing circuit may be coupled to Design for Testability (DFT) circuitry in the IC, and in other embodiments the FIB analysis circuit outputs FIB-ed signals to the IC pads and/or inputs Select control from the IC pads using Scan-Test circuitry.

Figure 2A:
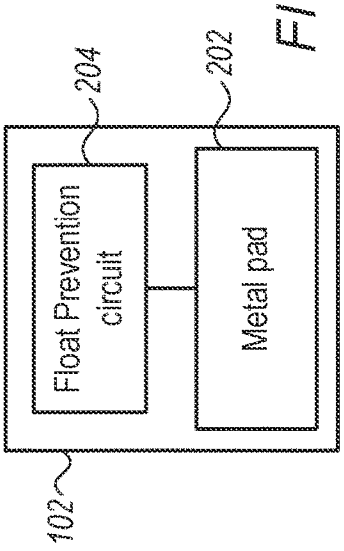
FIG. 2A is a block diagram that schematically illustrates a basic FIB element (BFE), in accordance with an embodiment of the present invention.

FIG. 2A is a block diagram that schematically illustrates a BFE 102, in accordance with an embodiment of the present invention. The BFE comprises a metal pad, which is typically square, and used to allow easy FIB connection to functional nodes.

In embodiments, BFE 102 may comprise a supply-path circuit (also referred to as float prevention circuit) 204, which is coupled to a metal-pad 202. The main function of the float prevention circuit is to avoid high voltages which may develop on floating inputs to routing circuit 104 when the BFE is not connected to a functional node, and to avoid intermediate voltage levels which may cause high current consumption (e.g., if the floating voltage is close to the trip point) or oscillation of the output (e.g., when the floating is noisy). In some embodiments, not all (and, sometimes, none) of the BFEs comprises a float prevention circuit, as such circuits may be incorporated in the routing circuit. In various embodiments, to save area, the float prevention circuit may overlap the metal pad, partly or fully.

The configuration of BFE 102 illustrated in FIG. 2A and described herein above is cited by way of example. Other configurations may be used in alternative embodiments. For example, for backside FIB the metal pad is an M1 pad, whereas for frontside FIB the metal pad is an Mn pad, where M1 is the first metal layer (nearest to the active device), and Mn is the top metal layer. In other embodiments, the metal pad comprises an M1 pad in parallel to an Mn pad, to allow both frontside and backside FIB.

We will next describe five example embodiments of float prevention circuits 204. The selection of the float prevention circuit type may be done according to cost of the various devices in the given process node, the speed of the circuit, the strength of the logic transistors, use of dynamic logic in the IC, and others.

Figure 2C:
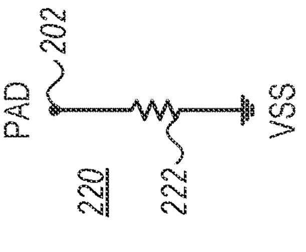
FIG. 2C is a circuit diagram that schematically illustrates a passive pull-down supply-path circuit, in accordance with an embodiment of the present invention.
Figure 2B:
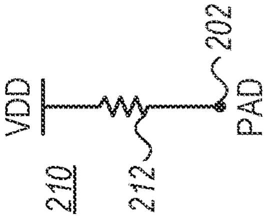
FIG. 2B is a circuit diagram that schematically illustrates a passive pull-up supply-path circuit, in accordance with an embodiment of the present invention.

FIG. 2B is a circuit diagram that schematically illustrates a passive pull-up float prevention circuit (supply-path circuit) 210, in accordance with an embodiment of the present invention. Circuit 210 comprises a passive resistor 212 (e.g., a diffusion, or a polysilicon, with suitable L/W ratio), that is connected between the Vdd power rail and metal pad 202.

FIG. 2C is a circuit diagram that schematically illustrates a passive pull-down float prevention circuit (supply-path circuit) 220, in accordance with an embodiment of the present invention. Circuit 220 comprises a passive resistor 222, that is connected between the Vss power rail and the metal pad.

Figure 2E:
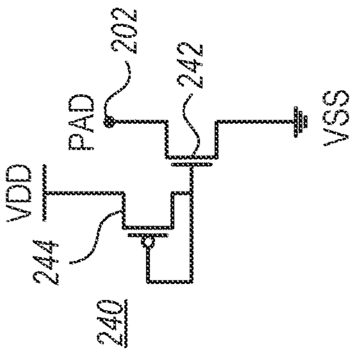
FIG. 2E is a circuit diagram that schematically illustrates an active pull-down supply-path circuit, in accordance with an embodiment of the present invention.
Figure 2D:
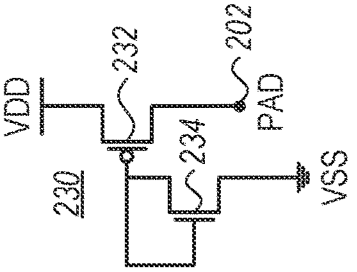
FIG. 2D is a circuit diagram that schematically illustrates an active pull-up supply-path circuit, in accordance with an embodiment of the present invention.

FIG. 2D is a circuit diagram that schematically illustrates an active pull-up float prevention circuit (supply-path circuit) 230, in accordance with an embodiment of the present invention. Circuit 230 comprises a PMOS transistor 232 with suitable L/W ratio, that is connected between the Vdd power rail and metal pad 202. The gate of transistor 232 is coupled by a diode-configured NMOS transistor 234 to the Vss rail, so that transistor 232 will be in conduction (rather than saturation).

FIG. 2E is a circuit diagram that schematically illustrates an active pull-down float prevention circuit (supply-path circuit) 240, in accordance with an embodiment of the present invention. Circuit 240 comprises an NMOS transistor 242 with suitable L/W ratio, that is connected between the Vss power rail and metal pad 202. The gate of transistor 242 is coupled by a diode-configured PMOS transistor 244 to the Vdd rail, so that transistor 242 will be in conduction.

Figure 2F:
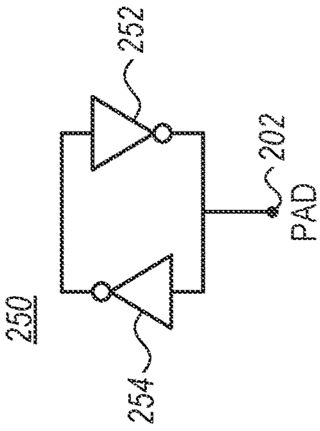
FIG. 2F is a circuit diagram that schematically illustrates a keeper-type supply-path circuit, in accordance with an embodiment of the present invention.

Lastly, FIG. 2F is a circuit diagram that schematically illustrates a keeper-type float prevention (supply-path circuit) 250, in accordance with an embodiment of the present invention. Circuit 250 comprises a weak inverter 252 that is cross coupled with an inverter 254 to form a latch.

The impedance of the pull-up and pull-down circuits described above is set, in embodiments, according to the drive of the respective nodes and the intrinsic resistances of the polysilicon and/or diffusion layers of the process technology being used. If the pull-down/pull-up impedance for a reasonably sized resistor is high relative to the output impedances of the buffers that drive the respective nodes, FIB etching will be needed to disconnect the pull-up/pull-down circuit. If the driver's impedance is significantly lower, the pull-up/pull-down may remain connected, saving a FIB etching procedure. If, in an embodiment, etching will always be used, the pull-up/pull-down circuit may be replaced by a metal short.

The configurations of float prevention circuits (supply-path circuits) 210, 220, 230, 240 and 250, illustrated in FIGS. 2B through 2F and described above, are cited by way of example. Other float prevention circuits may be used in alternative embodiments. For example, in embodiments, active pull-up or pull-down float prevention circuits are used in which the gate of the transistor is coupled to global bias voltage (rather than generated locally, in each BFE). In some embodiments, the IC process technology allows floating inputs (e.g., bipolar-transistor-based technology), and no float prevention circuits are needed.

Figure 3B:
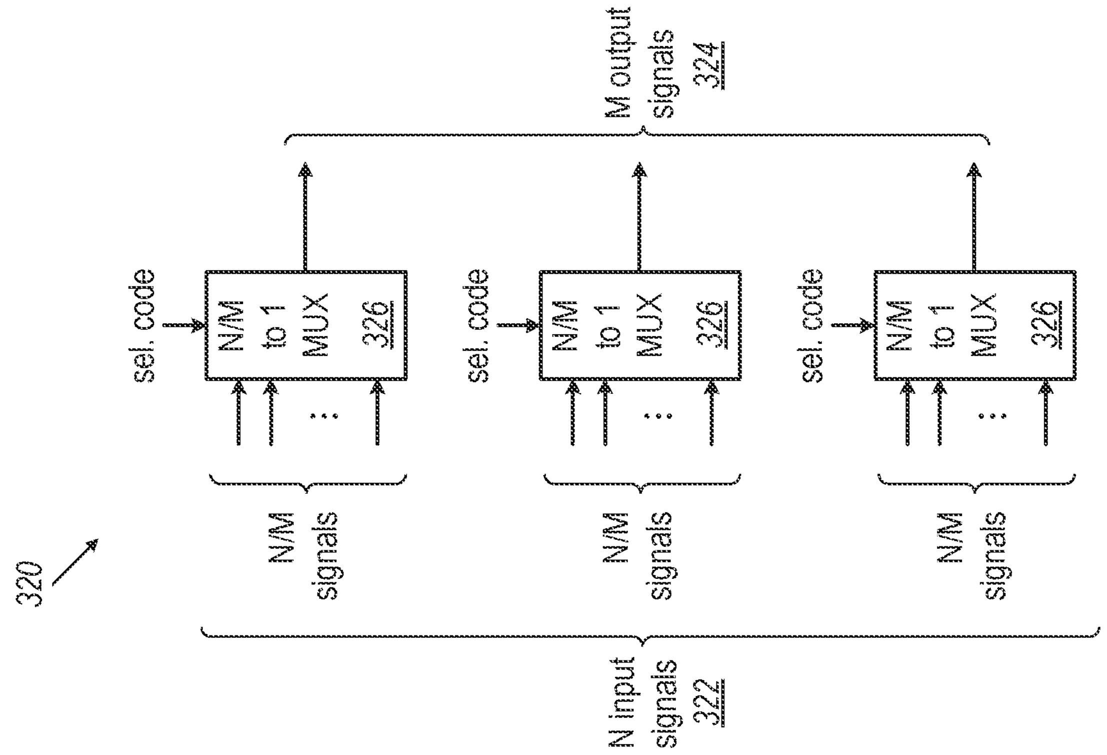
FIG. 3B is a block diagram that schematically illustrates a partial-flexibility routing circuit, in accordance with an embodiment of the present invention.
Figure 3A:
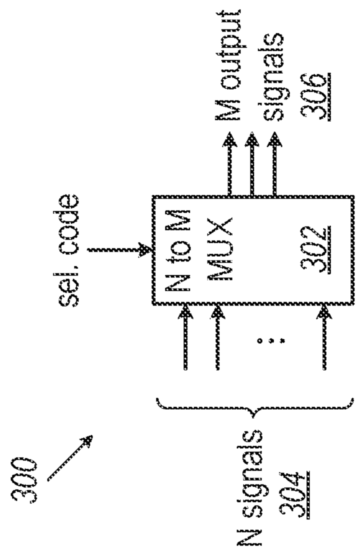
FIG. 3A is a block diagram that schematically illustrates a full-flexibility routing circuit, in accordance with an embodiment of the present invention.

FIG. 3A is a block diagram that schematically illustrates a full-flexibility routing circuit 300, in accordance with an embodiment of the present invention. The routing circuit comprises an N to M multiplexer 302, which is configured to multiplex, responsively to a select-code, M of N input signals 304 (typically wired to N BFEs of the IC) to M output signals 306. (The verb multiplex, in the current context, refers to reflecting the logic state of one or more input signals on corresponding output signals; multiplexing may be done, for example, by MOS transfer gates, followed by a buffer stage, or by a logic gate, such as a compound and-or gate. In some embodiments, multiplexing inverts the logic state of the outputs relative to the logic state of the respective input.)

In a typical embodiment, the BFE grid covers a 10 mm×10 mm area of functional circuitry and the BFEs are located on a 500μ×500μ grid. The number of BFEs (N) is, hence, (20−1)*(20−1)=361. Assuming M=4, the full-flexibility routing circuit 300 will comprise four 400-to-1 multiplexers and, thus, may be slow.

FIG. 3B is a block diagram that schematically illustrates a partial-flexibility routing circuit 320, in accordance with an embodiment of the present invention. The routing circuit is configured to transfer M signals from a group 322 of N input signals to a group 324 of M output signals.

Routing circuit 320 comprises M M/N to N single-bit multiplexers 326, each multiplexer multiplexing a single input of the M/N inputs, responsively to a selection code. With a 500μ×500μ grid covering a functional area of 10 mm×10 mm, routing circuit 320 will comprise four 100-to-1 multiplexers, consuming less area and achieving higher speeds than routing circuit 300. However, the flexibility of routing circuit 320 is only partial—for any given setting of the Select signals, three other signals cannot be multiplexed (unless they are connected by the FIB to remote BFEs, if possible). For example, if four signals of a bus are routed to the same multiplexer 326, it is not possible to monitor the full bus contents using FIB connection to nearest BFEs.

The configurations of routing circuits 300 and 320, illustrated in FIGS. 3A, 3B and described herein above are cited by way of example. Other configurations may be used in alternative embodiments. For example, in some embodiments, an intermediate flexibility configuration may be used, wherein each of the N signals is routed to two 2N-to-1 multiplexers. In other embodiments, the flexibility may change throughout the IC, with higher flexibility in dense logic areas. In an embodiment, the unused BFEs are tied to logic-0 and the multiplexer may be replaced by a tree of OR gates; in another embodiment, the unused BFEs are tied to logic-1 and the multiplexer is be replaced by a tree of AND gates.

Figure 4:
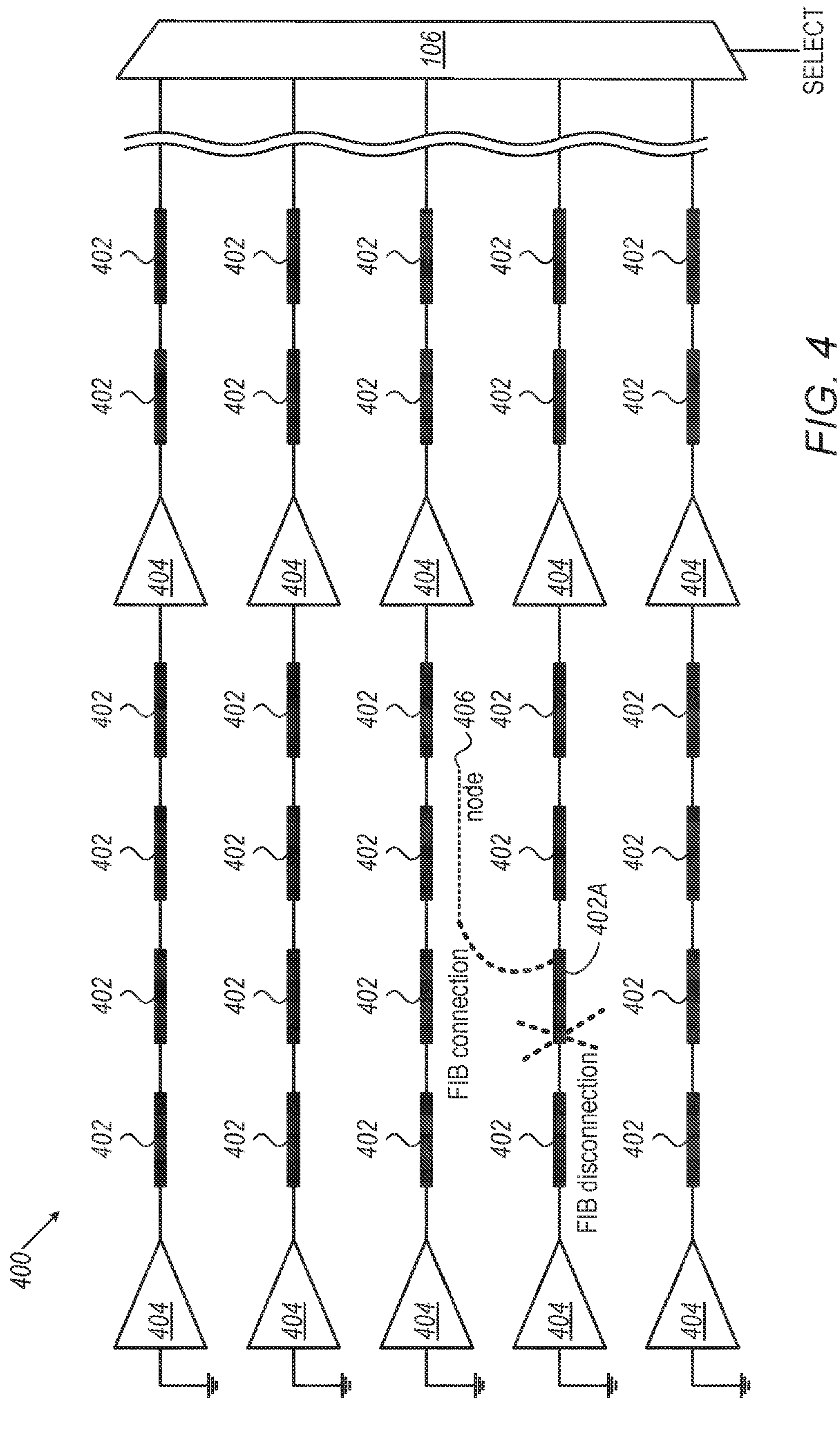
FIG. 4 is diagram that schematically illustrates an IC with a buffered grid of BFEs, in accordance with an embodiment of the present invention.

FIG. 4 is a block diagram that schematically illustrates an IC 400 with a buffered grid of BFEs 402, in accordance with an embodiment of the present invention. Each BFE 402 comprises a horizontal stretch of a metal pad and does not include a float prevention circuit. Groups of BFEs along parallel horizontal lines form serially connected chains, from a Vss tie (at the left hand) to an input of routing circuit 106. Buffers 404 are added to the chains, to amplify the signals.

To debug a signal on a functional node 406, the user deposits a conductor to connect the node to a BFE 402A, and then etches the connection of the BFE to the left-neighbor BFE. The respective chain, thus, will start with the signal at node 406, and end at routing circuit 106.

When compared with the BFE grid layout of IC 100 (FIG. 1), the BFE grid of IC 400 is simpler, and occupies a smaller amount of IC layout. The downside, however, is reduced flexibility-only one node can be analyzed in each horizontal chain (Of course, when two vertically-aligned signals are to be analyzed, one of the signals may be routed to a vertically remote chain, using a FIB deposition that is longer than half the distance between BFEs).

The buffer-grid configuration of IC 400 illustrated in FIG. 4 and described herein above is cited by way of example. Other embodiments may be used in alternative embodiments. For example, in embodiments, some or all of the chains may be tied to Vad rather than Vss. In an embodiment, each chain is made of two chains that start at the middle of the IC and span left and right, to two sets of routing circuits.

Backside and Frontside FIB

The active elements of an IC, e.g., diffusion and gates, are typically coupled to the lower metal layer-M1. For efficient routing, more metal layers are deposited above M1 (Typically, ICs have between 4 to 8 metal layers, but some advanced designs can have up to 12 or more). To form electrical connections between different metal layers, multiple Vertical Interconnect Access (VIAs) are used. The process of adding metal layers and VIAs to an IC is referred to as IC Metallization.

Backside FIB, in which FIB (and micro-probing) are done from the substrate side of the IC, is more suitable for the analysis of active devices, because M1 is the metal layer nearest to the FIB aperture. Accessing active devices in Frontside FIB is more challenging and may require going through a dense mesh of upper metal layers, sometimes all the way down to M1 and the underlying active device.

In embodiments, vias to upper metal layers are added to the layout of the IC, to ease frontend FIB.

Figure 5:
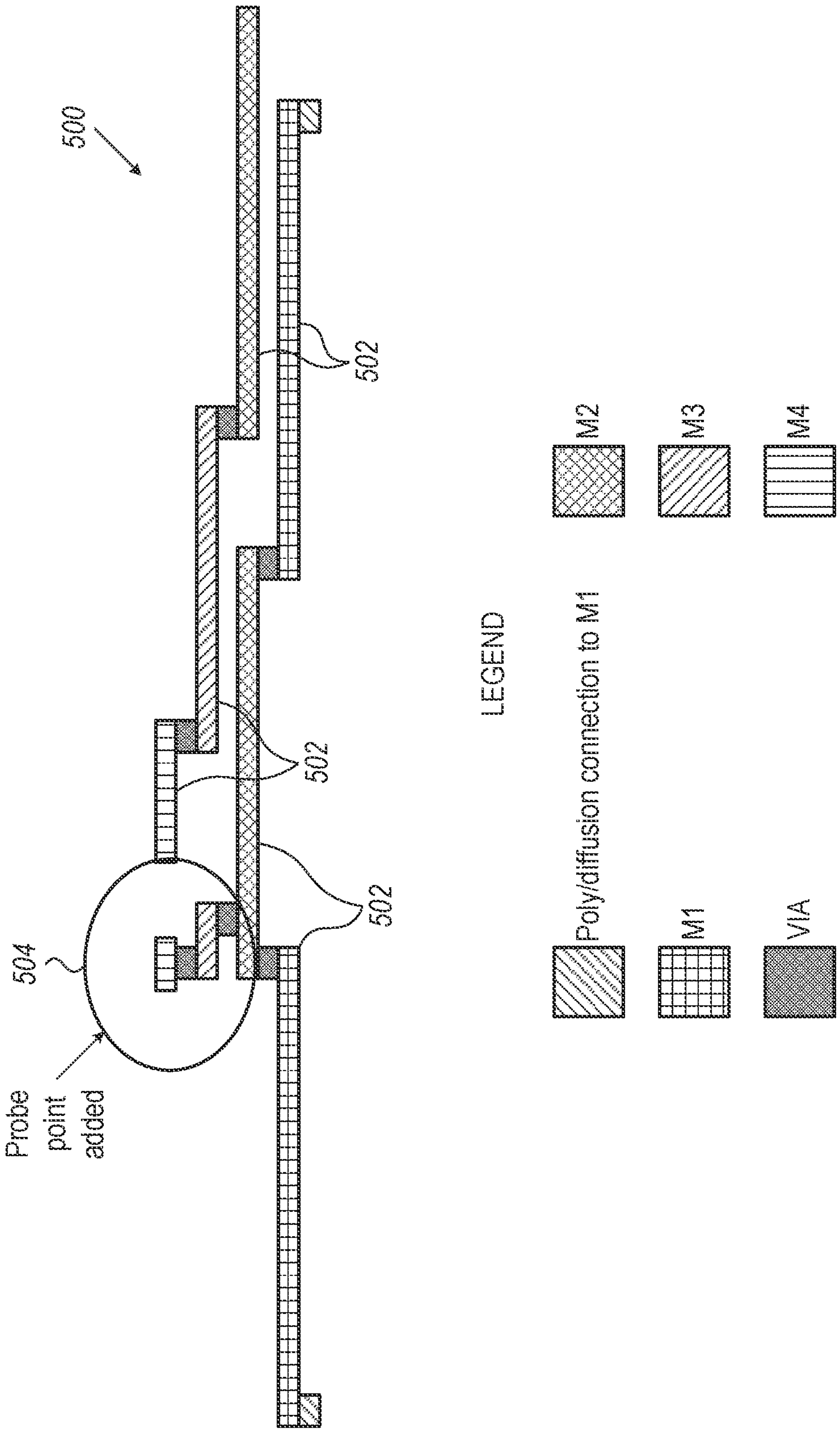
FIG. 5 is a diagram that schematically illustrates a cross section of an IC metallization, in accordance with an embodiment of the present invention.

FIG. 5 is a diagram that schematically illustrates a cross section of an IC metallization 500, in accordance with an embodiment of the present invention. The metallization comprises functional metallization 502, which includes four metal layers and vias, and FIB-support metallization 504, in which an M3 and an M4 sections, with inter-layer vias, connect an active circuit to the top metal layer.

The cross-section of IC metallization 500 illustrated in FIG. 5 and described herein above is an example that is cited merely for the sake of conceptual clarity. Other metallization schemes with various topologies may be used in alternative embodiments. For example, in some embodiments, the number of metal layers may be more than four.

Figure 6B:
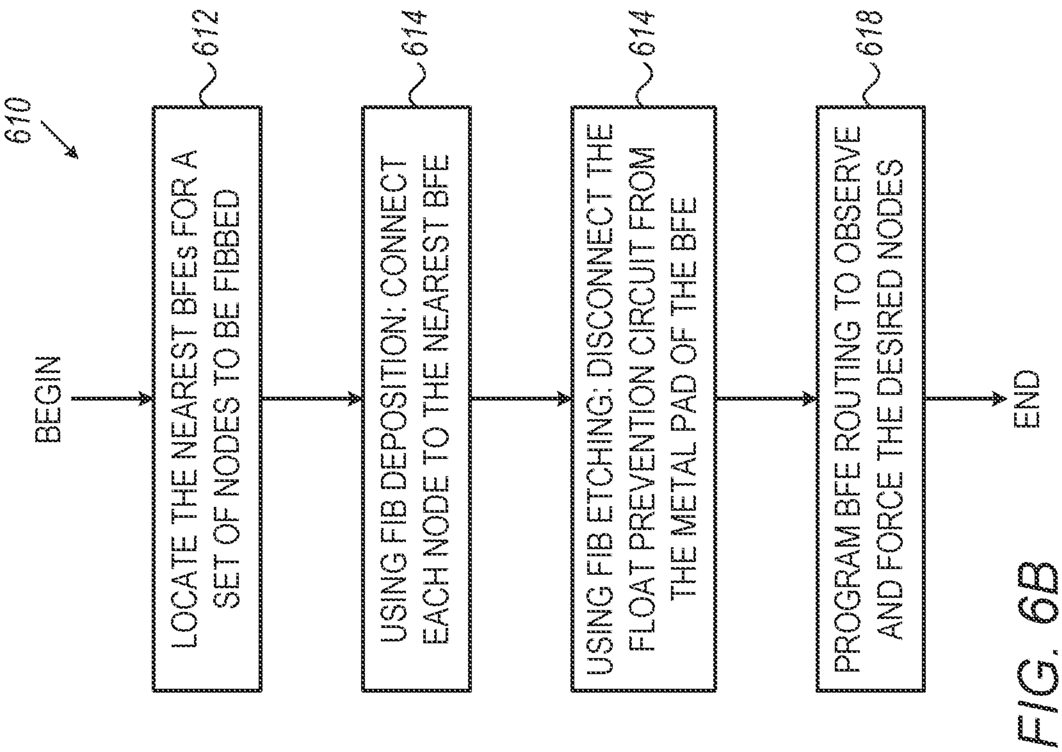
FIG. 6B is a flowchart that schematically illustrates a method for analyzing an IC using FIB, in accordance with an embodiment of the present invention.
Figure 6A:
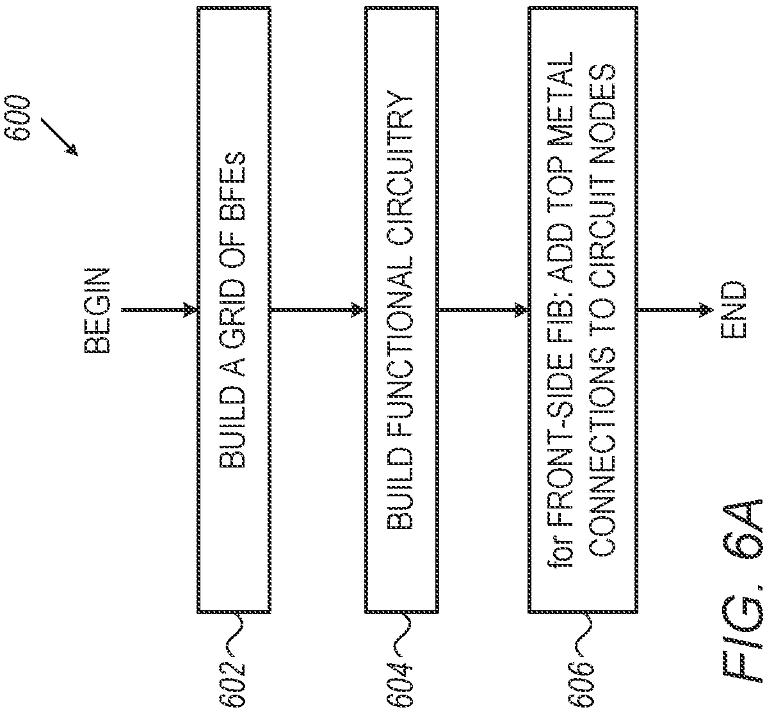
FIG. 6A is a flowchart that schematically illustrates a method for adding FIB-ready structures and circuits in an IC, in accordance with an embodiment of the present invention.

FIG. 6A is a flowchart 600 that schematically illustrates a method for adding FIB-ready structures and circuits in an IC, in accordance with an embodiment of the present invention. The flowchart is executed by an automatic Place and Route (P&R) software tool (or by other suitable computer-aided-design (CAD) tools).

The flowchart starts at a Build-BFE grid operation 602, wherein the P&R tool builds an evenly-spaced two-dimensional grid of BFEs ("builds", in the current context, refers to preparing an IC fabrication masks database, which will build the grid on the IC during IC fabrication). In some embodiments, the grid is square; in other embodiments, the grid is rectangular but is not square; in yet other embodiments, any other suitable grid form may be used.

In some embodiments, some or all the BFEs comprise float prevention circuits, such as a passive or an active connection to a supply rail, or a keeper circuit.

Next, at a Build-Functional-Circuitry operation 604, the P&R tool places and routes all the functional circuits of the IC. The distance between any active device and the nearest BFE will be limited according to the grid size of BFEs.

Lastly, at an Add-Top-Metal operation 606, the P&R tool builds connections from some (or all) the nodes of the IC to the top-level metal, using intermediate metal layers and vias (this last operation may result in further P&R steps, as it may affect wires routed in operation 604).

FIG. 6B is a flowchart 610 that schematically illustrates a method for analyzing an IC using FIB, in accordance with an embodiment of the present invention. The flowchart is typically executed by a debug engineer, in collaboration with an FIB technician.

The flowchart starts at a Locate-Nearest-BFE operation 612, wherein the debug engineer locates, for each node of a given set of nodes to be analyzed using FIB, the nearest BFE. Next, at a FIB-Deposition operation 614, the FIB technician deposits a metal connection between each of the nodes and the nearest BFE.

At a Disconnect float Prevention Circuit operation 616, the FIB technician etches-out the connection of the BFEs pads from the respective float prevention circuits (in some embodiments, cutting the float prevention circuit may not be required).

Lastly, at a Program BFE routing operation 618, the debug engineer programs FIB analysis circuit 108 to observe the given set of nodes. In some embodiments, the programming comprises forcing a binary code on predefined input pads of the IC; in other embodiments, the debug engineer programs an FIB control register to select the set of nodes.

In summary, the methods and apparatuses described herein with reference to FIGS. 1 through 6 ease the process of FIB analysis of complex integrated circuits by preparing FIB support circuits including basic FIB elements in the IC during the IC design, and by connecting nodes to the basic FIB elements during FIB analysis.

Although the embodiments described herein refer mainly to FIB analysis in integrated circuits, the disclosed techniques may be applicable to other applications, such as printed circuit board debug IC Package substrate and IC package interposers.

The different FIB support elements described herein can be implemented, for example, in Application-Specific Integrated Circuits (ASICs) or Field-Programmable Gate Arrays (FPGAs)

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An Integrated Circuit (IC) designed for debugging by Focused Ion Beam (FIB) editing, the IC comprising:

functional circuitry comprising functional nodes;

multiple Basic FIB elements (BFEs) distributed over an area of the IC, each of the multiple BFEs comprising at least a respective metal pad; and routing circuitry connected to the multiple BFEs, wherein, after a functional node among the functional nodes has been connected using the FIB editing to a BFE among the BFEs, the routing circuitry is configured to route a signal from the functional node, via the BFE, to a FIB analysis circuit in the IC or to one or more external connections of the IC.

2. The IC according to claim 1, wherein at least a given BFE among the multiple BFEs further comprises a respective supply-path circuit configured to provide a galvanic path between the given BFE and a supply input of the IC.

3. The IC according to claim 2, wherein the supply-path circuit comprises a passive resistor that is coupled to a supply rail of the IC.

4. The IC according to claim 2, wherein the supply-path circuit comprises an active resistance path to a supply rail of the IC.

5. The IC according to claim 2, wherein the supply-path circuit comprises a keeper circuit.

6. The IC according to claim 2, wherein, in a given BFE, the metal pad at least partially overlaps the supply-path circuit.

7. The IC according to claim 1, wherein a maximum distance between any functional node and a nearest BFE is not larger than a predefined maximum FIB-distance.

8. The IC according to claim 1, wherein at least some of the metal pads of the BFEs are disposed in a Metal-1 layer of the IC.

9. The IC according to claim 1, wherein at least some of the metal pads of the BFEs are disposed in a Top Metal layer of the IC.

10. The IC according to claim 1, wherein the routing circuitry comprises one or more multiplexers.

11. The IC according to claim 1, wherein the routing circuitry comprises a chain of buffers.

12. The IC according to claim 1, further comprising a FIB-connection pad, which is (i) connected to a functional node of the functional circuitry, (ii) fabricated in a same layer as a metal pad of a given BFE, and (iii) configured to be connected using the FIB editing to the metal pad of the given BFE.

13. A method for producing an Integrated Circuit (IC) designed for debugging by Focused Ion Beam (FIB) editing, the method comprising:

fabricating in the IC functional circuitry comprising functional nodes;

fabricating in the IC multiple Basic FIB elements (BFEs) distributed over an area of the IC, each of the multiple BFEs comprising at least a respective metal pad; and fabricating in the IC routing circuitry connected to the multiple BFEs, wherein, after a functional node among the functional nodes has been connected using the FIB editing to a BFE among the BFEs, the routing circuitry is configured to route a signal from the functional node, via the BFE, to a FIB analysis circuit in the IC or to one or more external connections of the IC.

14. A method for debugging an Integrated Circuit (IC) by Focused Ion Beam (FIB) editing, the method comprising:

operating an IC that comprises (i) functional circuitry comprising functional nodes, (ii) multiple Basic FIB elements (BFEs) distributed over an area of the IC, each of the multiple BFEs comprising at least a respective metal pad, and (iii) routing circuitry connected to the multiple BFEs;

applying the FIB editing to at least a selected functional node among the functional nodes and to at least a selected BFE among the BFEs; and monitoring, by a FIB analysis circuit in the IC or via one or more external connections of the IC, a signal routed by the routing circuitry from the selected functional node.

15. The method according to claim 14, wherein applying the FIB editing comprises connecting the selected functional node to the selected BFE using FIB deposition.

16. The method according to claim 15, wherein the selected BFE is connected to a supply input of the IC by a supply-path circuit, and wherein applying the FIB editing further comprises disconnecting the supply-path circuit from the metal pad of the selected BFE using FIB etching.

17. The method according to claim 15, wherein the selected BFE is connected to a supply input of the IC by a supply-path circuit, and wherein applying the FIB editing comprises disconnecting a transistor of the supply-path circuit of the selected BFE using FIB etching.

* * * * *